United States Patent
Lee et al.

(10) Patent No.: US 9,601,340 B2
(45) Date of Patent: Mar. 21, 2017

(54) ELECTRONIC DEVICE HAVING QUANTUM DOTS AND METHOD OF MANUFACTURING THE SAME

(71) Applicants: SAMSUNG ELECTRONICS CO., LTD., Suwon-si (KR); KOREA PHOTONICS TECHNOLOGY INSTITUTE, Gwangju (KR)

(72) Inventors: Jaesoong Lee, Suwon-si (KR); Hyoin Kim, Gwangju (KR)

(73) Assignees: SAMSUNG ELECTRONICS CO., LTD., Suwon-si (KR); KOREA PHOTONICS TECHNOLOGY INSTITUTE, Gwangju (KR)

( * ) Notice: Subject to any disclaimer, the term of this patent is extended or adjusted under 35 U.S.C. 154(b) by 0 days.

(21) Appl. No.: 14/474,995

(22) Filed: Sep. 2, 2014

(65) Prior Publication Data

US 2015/0295128 A1    Oct. 15, 2015

(30) Foreign Application Priority Data

Apr. 11, 2014 (KR) .................. 10-2014-0043681

(51) Int. Cl.
*H01L 29/16* (2006.01)
*H01L 27/15* (2006.01)
(Continued)

(52) U.S. Cl.
CPC ........ *H01L 21/28575* (2013.01); *B82Y 10/00* (2013.01); *B82Y 40/00* (2013.01);
(Continued)

(58) Field of Classification Search
CPC ......... H01L 33/06; H01L 33/00; H01L 21/02; H01L 29/122; H01L 21/28; H01L 27/15; H01L 31/02
USPC ....... 257/13, 14, 43, 40, 69, 88, 79, E21.11, 257/E29.07, E31.004, E31.008, E31.001, 257/E21.411, 76, 104, E29.079, E29.08; 438/22–27, 65, 71, 95, 122–127, 151, 438/257, 478, 666, 924
See application file for complete search history.

(56) References Cited

U.S. PATENT DOCUMENTS 7,358,160 B2    4/2008  Li et al.
8,268,646 B2    9/2012  Kryliouk et al.
(Continued)

FOREIGN PATENT DOCUMENTS

KR      10-0682942 B1    2/2007
KR    10-2011-0052131 A   5/2011
KR      10-1273702 B1    6/2013

OTHER PUBLICATIONS

M. Heiss et al., "Self-assembled quantum dots in a nanowire system for quantum photonics", Nature Materials, DOI: 10.1038/NMAT3557, Dec. 21, 2012, 7 pgs. total.

*Primary Examiner* — Jessica Manno
*Assistant Examiner* — Sheikh Maruf
(74) *Attorney, Agent, or Firm* — Sughrue Mion, PLLC

(57) ABSTRACT

Provided are electronic devices having quantum dots and methods of manufacturing the same. An electronic device includes a first nanorod, a quantum dot disposed on an upper surface of the first nanorod, and a second nanorod that covers a lateral surface of the first nanorod and the quantum dot. The first nanorod and the second nanorod are of opposite types.

11 Claims, 7 Drawing Sheets

(51) Int. Cl.

| | |
|---|---|
| *H01L 31/12* | (2006.01) |
| *H01L 33/06* | (2010.01) |
| *H01L 21/285* | (2006.01) |
| *H01L 29/12* | (2006.01) |
| *H01L 21/02* | (2006.01) |
| *B82Y 10/00* | (2011.01) |
| *B82Y 40/00* | (2011.01) |
| *H01L 29/06* | (2006.01) |
| *H01L 29/205* | (2006.01) |
| *H01L 33/18* | (2010.01) |

(52) U.S. Cl.
CPC .... *H01L 21/0254* (2013.01); *H01L 21/02381* (2013.01); *H01L 21/02433* (2013.01); *H01L 21/02603* (2013.01); *H01L 21/02653* (2013.01); *H01L 29/068* (2013.01); *H01L 29/0676* (2013.01); *H01L 29/122* (2013.01); *H01L 29/205* (2013.01); *H01L 33/18* (2013.01)

(56) References Cited

U.S. PATENT DOCUMENTS

| | | | | |
|---|---|---|---|---|
| 2005/0051766 A1* | 3/2005 | Stokes | ............... | B82Y 10/00 257/17 |
| 2008/0035882 A1* | 2/2008 | Zhao | ............... | B24B 37/044 252/79.4 |
| 2008/0057203 A1* | 3/2008 | Robinson | ............... | H01L 31/0322 427/337 |
| 2008/0149941 A1* | 6/2008 | Li | ............... | B82Y 10/00 257/76 |
| 2010/0218827 A1* | 9/2010 | Aono | ............... | C25D 11/02 136/264 |
| 2010/0267222 A1* | 10/2010 | Robinson | ............... | B22F 1/0055 438/502 |
| 2010/0283045 A1* | 11/2010 | Uchida | ............... | B82Y 20/00 257/40 |
| 2011/0031494 A1* | 2/2011 | Fujii | ............... | H01L 51/0022 257/43 |
| 2011/0048490 A1* | 3/2011 | Bernius | ............... | H01L 31/0322 136/244 |
| 2011/0126891 A1* | 6/2011 | Goto | ............... | B82Y 20/00 136/255 |
| 2011/0143137 A1* | 6/2011 | Alivisatos | ............... | B82Y 10/00 428/373 |
| 2011/0171789 A1* | 7/2011 | Korgel | ............... | H01L 29/42332 438/151 |
| 2011/0232760 A1* | 9/2011 | Shirata | ............... | H01L 31/0322 136/262 |
| 2011/0294254 A1* | 12/2011 | Jackrel | ............... | H01L 31/0322 438/95 |
| 2012/0168910 A1* | 7/2012 | Jackrel | ............... | H01L 21/268 257/613 |
| 2012/0197364 A1* | 8/2012 | Banin | ............... | A61N 1/0543 607/115 |
| 2012/0205613 A1* | 8/2012 | Mi | ............... | B82Y 10/00 257/9 |
| 2012/0270363 A1* | 10/2012 | Jackrel | ............... | C23C 18/1204 438/95 |
| 2013/0011616 A1* | 1/2013 | Matsumura | ............... | G01N 21/554 428/148 |
| 2014/0110717 A1* | 4/2014 | Wenxu | ............... | H01L 21/02381 257/65 |
| 2015/0097193 A1* | 4/2015 | Yap | ............... | H01L 29/775 257/76 |

* cited by examiner

ELECTRONIC DEVICE HAVING QUANTUM DOTS AND METHOD OF MANUFACTURING THE SAME

RELATED APPLICATIONS

This application claims priority from Korean Patent Application No. 10-2014-0043681, filed on Apr. 11, 2014 in the Korean Intellectual Property Office, the disclosure of which is incorporated by reference herein in its entirety.

BACKGROUND

1. Field

Apparatuses and methods consistent with exemplary embodiments related to electronic devices, and more particularly, to electronic devices having quantum dots and methods of manufacturing the same.

2. Description of the Related Art

A device containing quantum dots may be used in various devices, such as light-emitting diodes (LEDs), laser diodes (LDs), detectors, power devices, and single electron transistors.

In such a device, the confinement state of the quantum dots may directly affect the characteristics of the device. In the case of a light-emitting device, the better the confinement of the quantum dots, the higher the efficiency of the light-emitting device.

As an example of a device that uses quantum dots, there is a device formed by a process of, after forming Si or InN nanorods on an Si substrate, growing a GaN layer by using the nanorods as a buffer layer. However, this process is relatively complicated and many crystal defects may still occur in the GaN layer that is finally formed.

SUMMARY

Exemplary embodiments provide electronic devices containing a quantum dot that have high efficiency and may be manufactured simply and methods of manufacturing the same.

According to an aspect of an exemplary embodiment, there is provided an electronic device including: a first nanorod; a quantum dot disposed on an upper surface of the first nanorod; and a second nanorod that covers a lateral surface of the first nanorod and the quantum dot, wherein the first and second nanorods are of opposite types.

The first nanorod may be formed directly on a substrate.

The electronic device may further include an insulating film and a resin film disposed on the insulating material, and the insulating film and the resin film are disposed around a lateral surface of the first nanorod.

An upper surface of a second nanorod may be located above the quantum dot, and a resin film may be located around the second nanorod.

The second nanorods may be disposed on the insulating film between the first nanorod and the resin film.

The resin film may include a hole, and the first nanorod may be disposed in the hole without contacting the resin film.

The second nanorod may be disposed in the hole and may be located between the edge of the hole and the first nanorod.

A lateral surface and an upper surface of the second nanorod may be covered by a conductive oxide film, and the first nanorod and the conductive oxide film may be separated from each other.

An upper surface of the conductive oxide film may be flat, and electrodes may be formed on the upper surface of the conductive oxide film.

According to an aspect of another exemplary embodiment, there is provided a method of manufacturing an electronic device, the method including: forming an insulating film on a substrate; forming a first hole through which the substrate is exposed in the insulating film; forming a first nanorod in the first hole; forming a quantum dot on an upper surface of the first nanorod; forming a resin film including a second hole on the insulating film, wherein the second hole exposes a portion of the insulating film around the first nanorod; forming a second nanorod covering the first nanorod and the quantum dot on the portion of the insulating film exposed by the second hole; forming a conductive oxide film on the resin film to cover the second nanorod; and forming an electrode on the conductive oxide film, wherein the first and the second nanorod different.

The forming the first nanorod in the first hole may include: growing a base film on a portion of the substrate that is exposed through the first hole and growing the first nanorod on the base film, wherein the base film includes a material that is the same as that of the first nanorod.

The first nanorod may be formed using a metal organic chemical vapor deposition (MOCVD) method or a molecular beam epitaxial (MBE) method.

The first nanorod and the quantum dot may be simultaneously formed by using a vapor liquid solid (VLS) epitaxial method.

The forming the first hole through which the substrate is exposed in the insulating film may include: forming a catalyst layer on the substrate; dividing the catalyst layer into a plurality of droplets; forming the insulating film around the droplets on the substrate, the insulating film having a thickness smaller than that of the droplets; and removing the droplets.

The forming the quantum dot may include: forming a Ga quantum dot on the upper surface of the first nanorod by using a droplet method; and doping the Ga quantum dot with As.

The second nanorod may be formed using a MOCVD method or a MBE method.

The first nanorod, the quantum dot, and the second nanorod may be formed in-situ.

The conductive oxide film may be formed by using a lateral overgrowth method.

BRIEF DESCRIPTION OF THE DRAWINGS

These and/or other aspects will become apparent and more readily appreciated from the following description of exemplary embodiments, taken in conjunction with the accompanying drawings in which.

DETAILED DESCRIPTION

Figure 1:
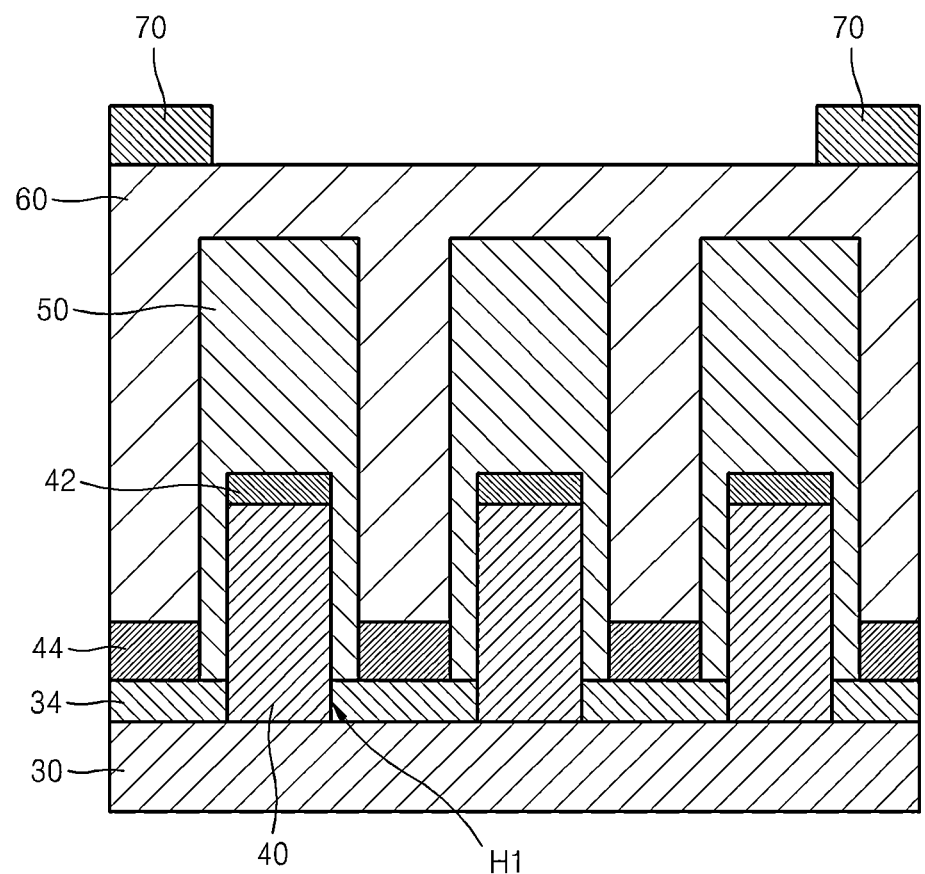
FIG. 1 is a cross-sectional view of an electronic device containing quantum dots, according to an exemplary embodiment.

An electronic device containing high quality quantum dots that are stably confined and a method of manufacturing the electronic device will be described herein with reference to the accompanying drawings. In the drawings, the thicknesses of layers and regions are exaggerated for the sake of clarity.

First, an electronic device containing quantum dots will be described. FIG. 1 is a cross-sectional view of an electronic device containing quantum dots, according to an exemplary embodiment.

Referring to FIG. 1, an insulating film 34 is formed on a substrate 30. A plurality of holes H1 through which the substrate 30 is exposed are formed in the insulating film 34. The holes H1 may be separated from each other by predetermined distances. Regions where first nanorods (or nanowires) 40 are grown are defined by the holes H1. Accordingly, a diameter of the holes H1 may be determined by taking the desired diameter of the first nanorods 40 into consideration. The first nanorods 40 may be referred to as lower nanorods. The substrate 30 may be a p-type substrate. The substrate 30 may be a silicon substrate, but is not limited thereto. The silicon substrate may be, for example, a (111) silicon substrate. The insulating film 34 may be an insulating oxide or nitride. The insulating film 34 may be, for example, silicon oxide. The silicon oxide may be, for example, $SiO_2$. The portions of the substrate 30 exposed by the holes H1 are covered by the first nanorods 40. The holes H1 are filed with portions of the first nanorods 40. The first nanorods 40 that fill the holes H1 extend upwards, that is, in a direction away from the substrate 30. Quantum dots 42 are formed on upper surfaces of the first nanorods 40, respectively. A crystal surface of a lateral surface and a crystal surface of an upper surface of the first nanorod 40 may be different types of crystal surfaces. The crystal surface of the upper surface of the first nanorod 40 may be a crystal surface that is appropriate for forming the quantum dots 42. Accordingly, the quantum dots 42 may be selectively formed on the upper surfaces of the first nanorods 40, respectively. The quantum dots 42 may be a material having a relatively wide band gap and a relatively low refractive index. The first nanorods 40 have a band gap in a range from about 1.4 eV to about 6.0 eV. The first nanorods 40 have a refractive index in a range from about 2.1 to about 3.8. The first nanorods 40 may be, for example, GaN nanorods or BN nanorods that are doped with an n-type dopant, but are not limited thereto. The first nanorods 40 may be formed from GaP, AlP, GaAs, AlAs, AlN, or AlGaN. The quantum dots 42 may be semiconductor quantum dots, for example, compound semiconductor quantum dots. The semiconductor quantum dots may be, for example, GaAs quantum dots.

The extended portions of the first nanorods 40 and the quantum dots 42 are covered by second nanorods 50 (or nanowires). The second nanorods 50 may directly contact lateral surfaces of the first nanorods 40 and may directly contact the quantum dots 42. The second nanorods 50 are formed on the insulating film 34. That is, the second nanorods 50 contact the insulating film 34 around the holes H1. A diameter of the second nanorods 50 is wider than the diameter of the first nanorods 40. The second nanorods 50 extend above the quantum dots 42 such that upper surfaces of the second nanorods 50 are located above the quantum dots 42. The second nanorods 50 may be nanorods of a type opposite to a type of the first nanorods 40, i.e., may have properties opposite to those of the first nanorods 40. For example, when the first nanorods 40 are P-type nanorods, the second nanorods 50 may be N-type nanorods doped with an N-type conductive dopant. Alternatively, the first nanorods 40 may be N-type nanorods, and the second nanorods 50 may be P-type nanorods. The second nanorods 50 may be nanorods having a relatively wide band gap and a relatively low refractive index or the second nanorods 50 may have a band gap range and a refractive index range that are the same as those of the first nanorods 40. The second nanorods 50 may be, for example, GaN or BN nanorods. The number of second nanorods 50 may be equal to the number of first nanorods 40. The second nanorods 50 may be referred to as upper nanorods. The first nanorods 40 are directly grown on the substrate 30 and may have relatively fewer crystal defects than in the related art. The quantum dots 42 are formed on the first nanorods 40, and the second nanorods 50 directly cover the entire extended portions of the first nanorods 40 and all the quantum dots 42, and thus, the first nanorods 40, the quantum dots 42, and the second nanorods 50 may constitute an electronic device, for example, a light-emitting diode, directly grown on the substrate 30. Since the second nanorods 50 directly cover the entire extended portions of the first nanorods 40 and all the quantum dots 42, the confinement of the quantum dots 42 by the first and second nanorods 40 and 50 is superior to devices in the related art. Accordingly, when the electronic device is a light-emitting diode, the efficiency, for example, the light emission efficiency, of the electronic device is superior to devices in the related art.

The second nanorods 50 are separated from each other. Parts of the insulating film 34 that are between the second nanorods 50 may be covered by a resin film 44. That is, the resin film 44 is formed between the second nanorods 50. The resin film 44 may be formed of, for example, an epoxy resin or a material having a patterning characteristic that is similar to that of an epoxy resin. The resin film 44 may be formed of SU-8, BCB, PDMS, or $SiO_2$, but is not limited thereto.

The second nanorods 50 and the resin film 44 are covered by a conductive oxide film 60. The entire surface of the second nanorods 50 may be covered by the conductive oxide film 60. An upper surface of the conductive oxide film 60 may be a flat surface. The upper surface of the conductive oxide film 60 is located above the upper surfaces of the second nanorods 50. The conductive oxide film 60 may be formed of, for example, ZnO or indium tin oxide (ITO), but is not limited thereto. The thicknesses of the insulating film 34, the resin film 44, and the conductive oxide film 60 may vary depending on the height of the first and second nanorods 40 and 50.

Electrodes 70 may be formed on the conductive oxide film 60. The electrodes 70 may be formed of Al, but are not limited thereto, that is, the electrodes 70 may be formed of any material that is used for forming electrodes for optical devices or semiconductor devices.

Next, a method of manufacturing an electronic device will be described with reference to FIGS. 2 through 12. The electronic device formed according to the method may be the electronic device described with reference to FIG. 1. In the descriptions below, like reference numerals are used to indicate elements that are substantially the same elements described with reference to FIG. 1, and repeated descriptions thereof will be omitted. FIGS. 2 through 12 are perspective views and cross-sectional views illustrating a method of manufacturing an electronic device having quantum dots, according to an exemplary embodiment.

Figure 2:
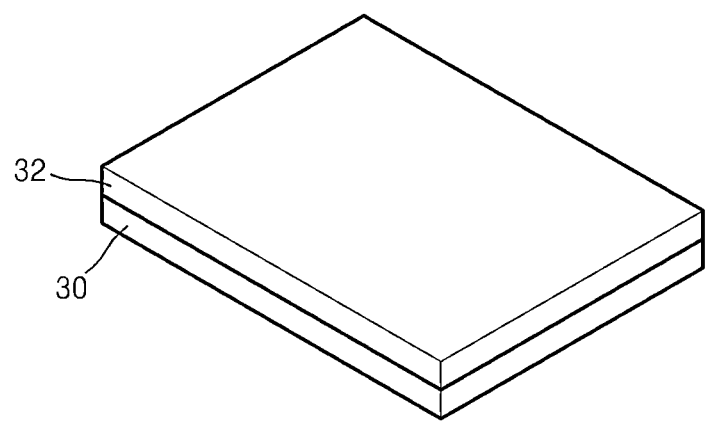
FIGS. 2 through 12 are perspective views and cross-sectional views illustrating a method of manufacturing an electronic device containing quantum dots, according to an exemplary embodiment.
Figure 3:
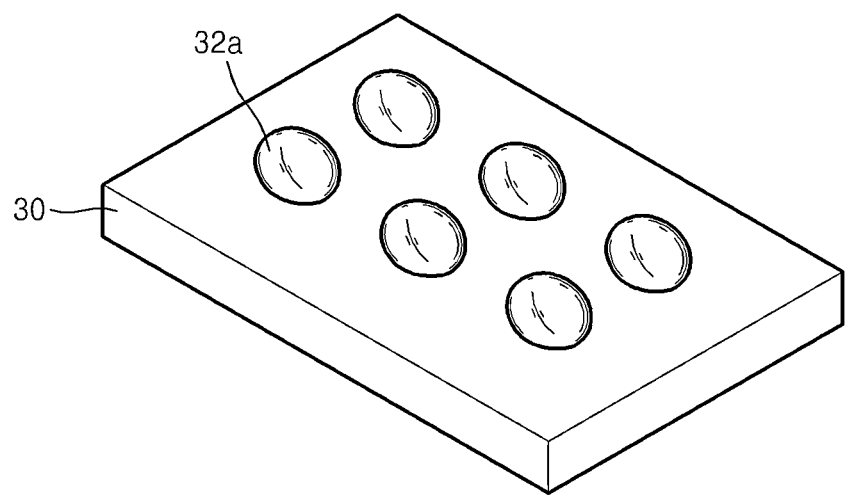

Referring to FIG. 2, a catalyst layer 32 is formed on a substrate 30. The catalyst layer 32 may be, for example, a gold layer, but is not limited thereto. After the catalyst layer 32 is formed, the resultant product is annealed at a predetermined temperature. As a result, as depicted in FIG. 3, a plurality of Au droplets 32a are formed on the substrate 30. The size of the Au droplets 32a may be determined by taking into consideration the desired diameter of the first nanorods 40 of FIG. 1. That is, there is a relationship between the size of the Au droplets 32a and the diameter of the first nanorods 40. The Au droplets 32a may be separated from each other. The annealing temperature may be a temperature at which the Au droplets 32a may be formed, for example, approximately 650° C. The annealing temperature may vary slightly based on the material that is used as the catalyst layer 32, the thickness of the catalyst layer 32, and the annealing atmosphere.

Figure 4:
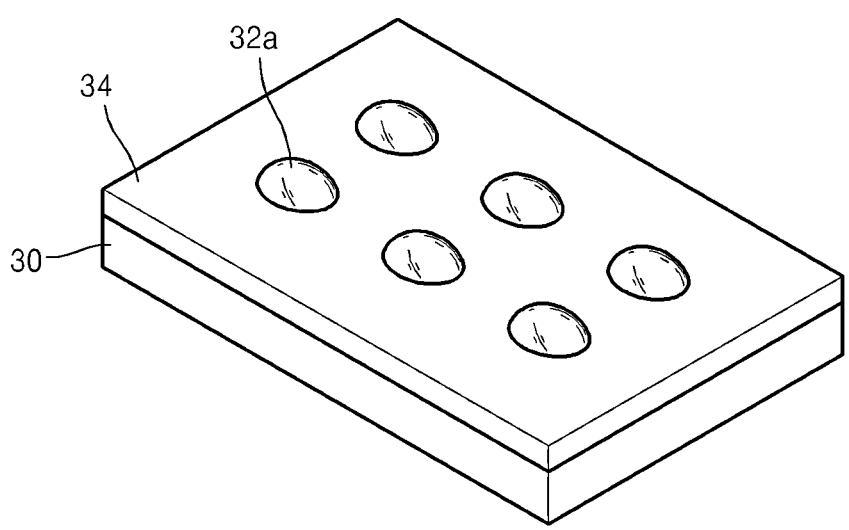

Referring to FIG. 4, an insulating film 34 is formed on the substrate 30 on which the Au droplets 32a are formed. The insulating film 34 may be, for example, an oxide film and may be formed by supplying oxygen gas. The process of forming the insulating film 34 may be performed at, for example, 800° C. for approximately 10 minutes. The insulating film 34 may be formed to have a thickness that may cover a surface of the substrate 30 between the Au droplets 32a. The thickness of the insulating film 34 may be smaller than the thickness or height of the Au droplets 32a. After the insulating film 34 is formed, the Au droplets 32a are removed by etching the Au droplets 32a. As a result, as depicted in FIG. 5, a plurality holes H1 are formed in the insulating film 34.

Figure 5:
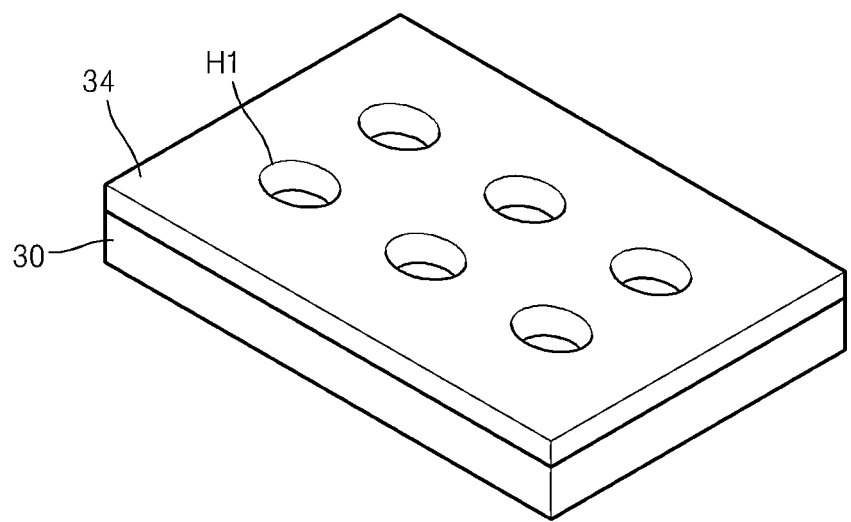

Referring to FIG. 5, the substrate 30 is exposed through the holes H1.

Figure 6:
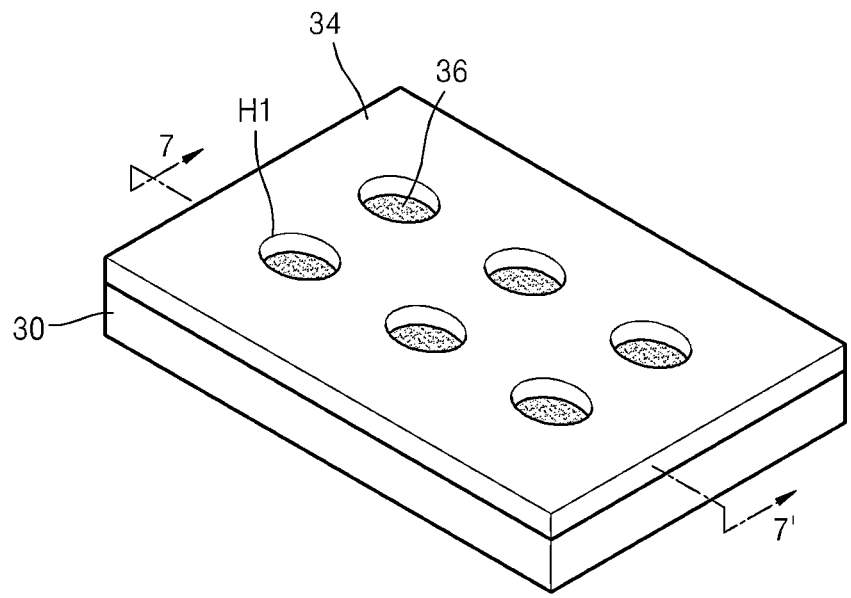

As depicted in FIG. 6, a surface of the substrate 30 that is exposed through the holes H1 is covered by base films 36. The base films 36 may be formed by an epitaxial method. The substrate 30 around the holes H1 are covered by the insulating film 34. Accordingly, the base films 36 may be selectively formed on a surface of the substrate 30 that is exposed through the holes H1. Each of the base films 36 may be a single layer or multiple layers that include a nano material. When the base film 36 includes a single layer, the base film 36 may be formed of, for example, GaN or BN. When the base film 36 includes multiple layers, the base film 36 may be a stacked film in which an AlGaN film and a GaN film are sequentially stacked.

Figure 7:
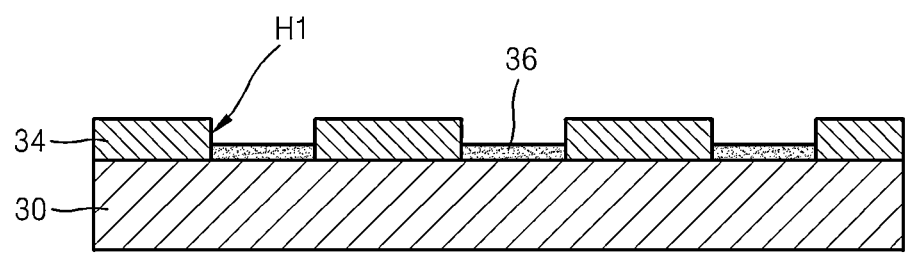

FIG. 7 is a cross-sectional view taken along line 7-7' of FIG. 6. Referring to FIG. 7, the base films 36 may have a smaller thickness than that of the insulating film 34.

Figure 8:
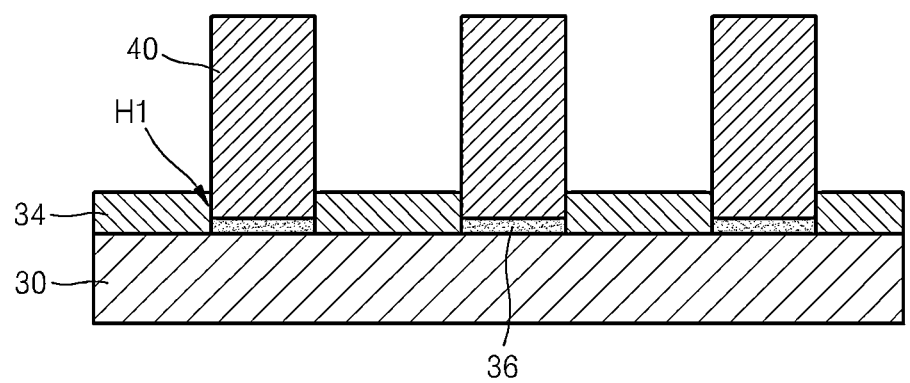
Figure 13:
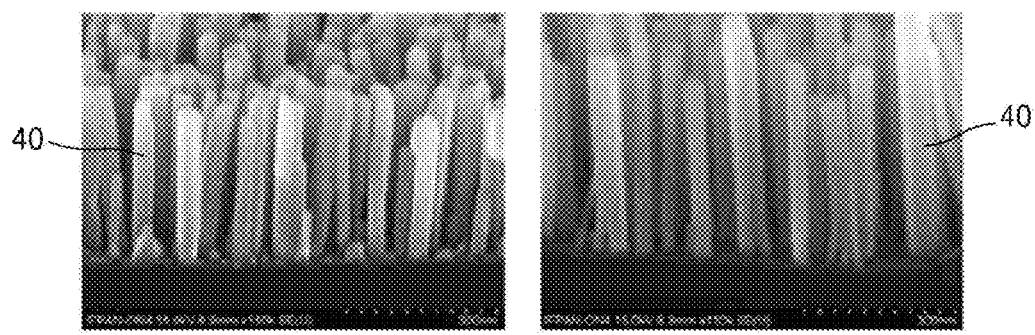
FIG. 13 is scanning electron microscope (SEM) images showing, as an example of first nanorods, GaN nanorods formed on a silicon substrate in an electronic device according to an exemplary embodiment.

Referring to FIG. 8, the first nanorods 40 are formed on the base films 36, respectively. The base films 36 may be formed from the same constituent element as the first nanorods 40. Accordingly, the base films 36 and the first nanorods 40 may not be distinguished. However, in the drawing, the base films 36 and the first nanorods 40 are distinguished for the sake of convenience. The first nanorods 40 may be formed by using a growing method, for example, a metal organic chemical vapor deposition (MOCVD) method or a molecular beam epitaxy (MBE) method. Also, the first nanorods 40 may be formed by using a vapor liquid solid (VLS) epitaxial method. When the first nanorods 40 are formed by using a VLS epitaxial method, the first nanorods 40 may be formed together with quantum dots 42 on upper surfaces of the first nanorods 40 according to a well-known growing mechanism. The first nanorods 40 respectively fill the holes H1 and may extend to a desired length in a direction away from the substrate 30. FIG. 13 is scanning electron microscope (SEM) images of actually grown first nanorods 40. Referring to FIG. 13, the first nanorods 40 are formed on the substrate 30.

Figure 9:
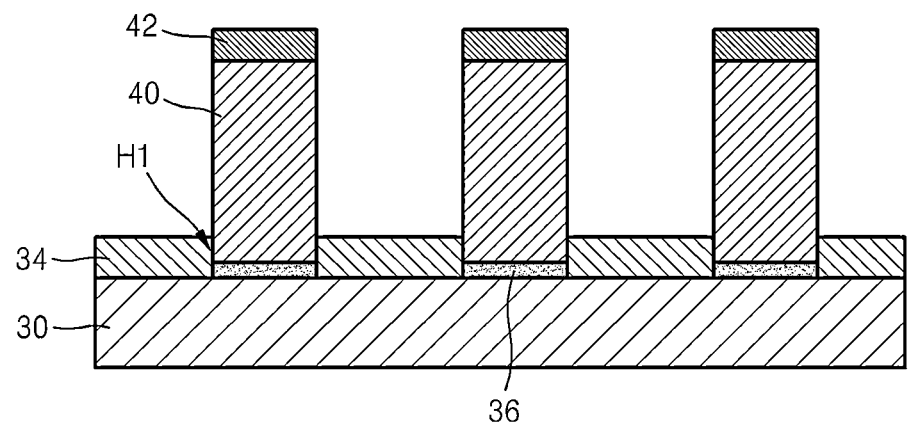
Figure 14:
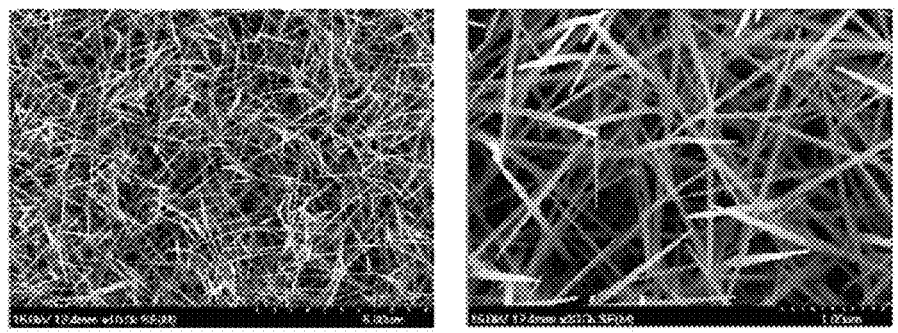
FIG. 14 is SEM images showing GaAs nanorods (nanowires) grown on a GaN substrate.

Next, referring to FIG. 9, the quantum dots 42 are formed on the upper surfaces of the first nanorods 40, respectively. When the first nanorods 40 are formed by using an MOCVD method or an MBE method, the quantum dots 42 may be formed by using a droplet method. For example, when the quantum dots 42 are GaAs quantum dots, after forming Ga on upper surfaces of the first nanorods 40, the GaAs quantum dots may be formed on the upper surfaces of the first nanorods 40 by supplying As gas onto the upper surfaces of the first nanorods 40. In this process, as the crystal surface of a lateral surface of the first nanorod 40 is different from that of the upper surface of the first nanorods 40, GaAs is not grown on the lateral surfaces of the first nanorod 40. Accordingly, the quantum dots 42 may be selectively formed on the upper surfaces of the first nanorods 40. Also, when the first nanorods 40 are formed using a VLS epitaxial method described above, the quantum dots 42 may be respectively formed on the upper surfaces of the first nanorods 40 according to a growing mechanism. FIG. 14 is SEM images showing GaAs nanorods (nanowires) actually grown on a GaN substrate.

Figure 10:
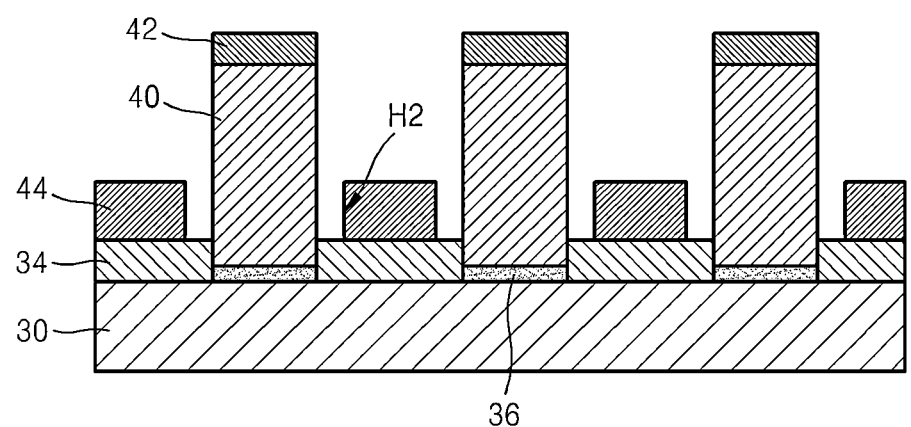

Referring to FIG. 10, after forming the quantum dots 42, a resin film 44 is formed on the insulating film 34 between the first nanorods 40. Regions on the insulating film 34, where second nanorods 50 will be formed, are defined by the resin film 44. The resin film 44 includes a plurality of holes H2. The first nanorods 40 are located inside the holes H2, respectively. Edges of the holes H2 are separate from, i.e., not in contact with the first nanorods 40.

Figure 11:
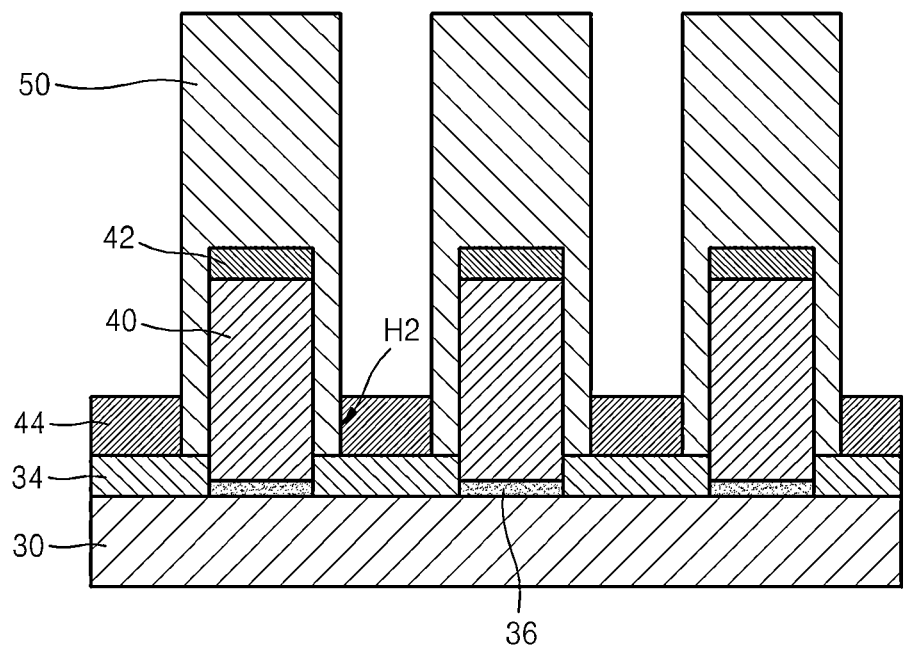

Referring to FIG. 11, the second nanorods 50 are formed on the insulating film 34 in the holes H2. The second nanorods 50 may be formed using an MOCVD method or an MBE method. The second nanorods 50 may be formed so to cover the entire exposed lateral surfaces of the first nanorods 40 and all the quantum dots 42. The second nanorods 50 may extend upwards above the quantum dots 42.

Figure 12:
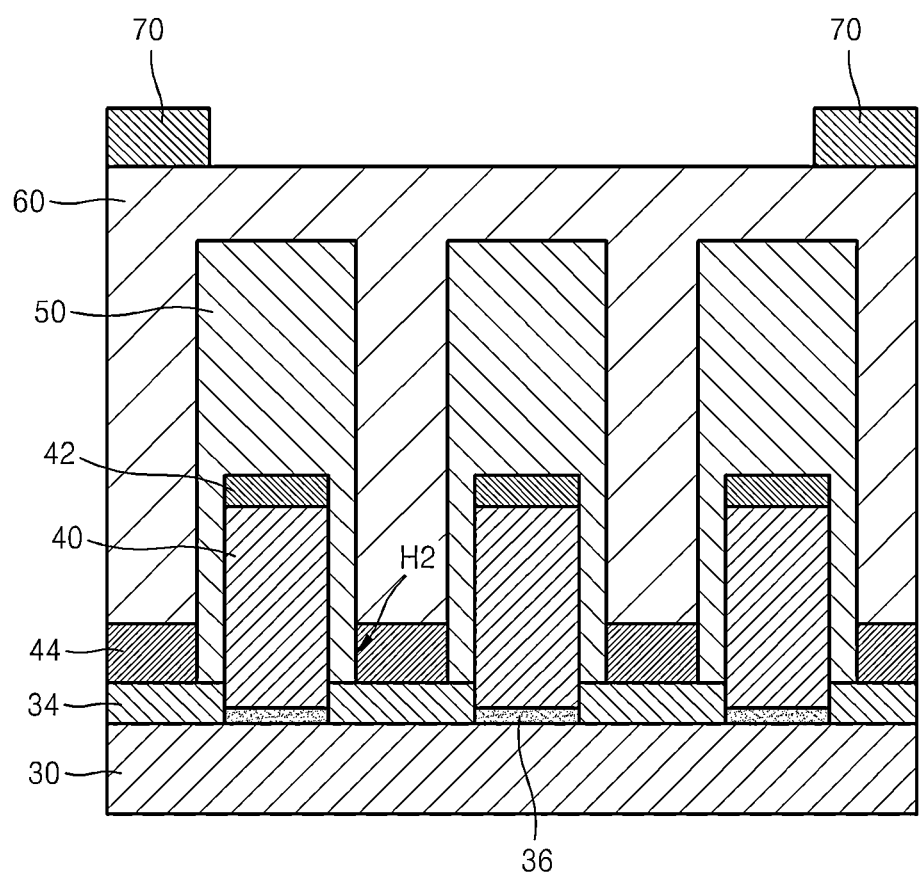

Referring to FIG. 12, a conductive oxide film 60 is formed on the resin film 44 to cover the second nanorods 50. The conductive oxide film 60 may be grown under a lateral overgrowth condition. Accordingly, the conductive oxide film 60 may be formed so to cover the lateral and the upper surfaces of the second nanorods 50, and thus a planarized upper surface may be obtained. After forming the conductive oxide film 60, electrodes 70 are formed on the conductive oxide film 60.

In the method described above, the first nanorods 40 are directly grown on the substrate 30, and the quantum dots 42 and the second nanorods 50 are sequentially formed on the first nanorods 40. Accordingly, the first nanorods 40, the quantum dots 42, and the second nanorods 50 may be formed in-situ, and thus, the manufacturing process may be simplified. Also, since the quantum dots 42 are grown on the upper surfaces of the first nanorods 40, a high quantum confinement is realized, and thus, a device having improved efficiency (for example, light-emitting efficiency) may be obtained. Also, the first and second nanorods 40 and 50 are materials having a relatively wide band gap, and thus, an electronic device according to an exemplary embodiment may be applied to high pressure resistance devices or power devices.

The electronic device described above includes an upper conductive nitride nanorod and a lower conductive nitride nanorod and quantum dots included between the upper and lower conductive nitride nanorods, and thus a device having a high quantum confinement may be realized. Accordingly, when the electronic device is a light-emitting device, an optical device having a high light-emitting efficiency may be realized.

The upper and lower conductive nitride may have a relatively wide band gap, and may be formed of a nitride (for example, GaN or BrN) having a relatively small refractive index, and thus, the electronic device may be applied to various devices, for example, QWIR detectors, high voltage or power devices, single electron tunneling transistors, or single photon detectors.

Further, by adding SPR etc. to a site controlled quantum device that may affect the band gap and tunnel junction of the electronic device, the efficiency of the electronic device may be further increased.

Further still, in the context of manufacturing the electronic device, materials having different lattice constants, for example, GaN and GaAs, may be directly grown on a substrate and grown into nanorod type, and thus, a stack structure (for example, GaN/GaAs/GaN) that is one dimensionally grown without strain may be realized. Accordingly, the manufacturing process may be simplified and operational characteristics may be further improved.

While exemplary embodiments have been described with reference to the figures, it will be understood by those of ordinary skill in the art that various changes in form and details may be made without departing from the spirit and scope of the inventive concept.

What is claimed is:

1. An electronic device comprising:
   a first nanorod;
   a quantum dot directly disposed on an upper surface of the first nanorod; and
   a second nanorod that covers a lateral surface of the first nanorod and the quantum dot,
   wherein the first nanorod and the second nanorod are of opposite types.

2. The electronic device of claim 1, wherein the first nanorod is formed directly on a substrate.

3. The electronic device of claim 1, further comprising an insulating film and a resin film disposed on the insulating material,
   wherein the insulating film and the resin film are disposed around the lateral surface the first nanorod.

4. The electronic device of claim 1, further comprising a resin film disposed around a lateral surface of the second nanorod,
   wherein an upper surface of the second nanorod is above the quantum dot.

5. The electronic device of claim 3, wherein the second nanorod is disposed on the insulating film between the first nanorod and the resin film.

6. The electronic device of claim 3, wherein the resin film comprises a hole, and the first nanorod is disposed in the hole of the resin film and does not contact the resin film.

7. The electronic device of claim 6, wherein the second nanorod is disposed in the hole of the resin film and is interposed between the resin film and the first nanorod.

8. The electronic device of claim 1, wherein a lateral surface and an upper surface of the second nanorod are covered by a conductive oxide film, and the first nanorod and the conductive oxide film do not contact each other.

9. The electronic device of claim 8, further comprising electrodes disposed on an upper surface of the conductive oxide film, wherein the upper surface of the conductive oxide film is flat.

10. The electronic device of claim 1, wherein the first nanorod has a band gap in a range from about 1.4 eV to about 6.0 eV.

11. The electronic device of claim 1, wherein the second nanorod has a band gap in a range from about 1.4 eV to about 6.0 eV.

* * * * *